United States Patent [19]

Naus

[11] Patent Number: 5,107,480
[45] Date of Patent: Apr. 21, 1992

[54] DEVICE FOR READING DIGITAL INFORMATION RECORDED ON AN INFORMATION CARRIER, AND PEAK DETECTOR AND INFORMATION CARRIER FOR SUCH A DEVICE

[75] Inventor: Peter J. A. Naus, Eindhoven, Netherlands

[73] Assignee: U.S. Philips Corporation, New York, N.Y.

[21] Appl. No.: 514,476

[22] Filed: Apr. 25, 1990

[30] Foreign Application Priority Data

Oct. 23, 1989 [NL] Netherlands .......................... 8902613

[51] Int. Cl.⁵ .......................... G11B 5/09; G11B 15/52; G11B 20/10; G11B 27/22
[52] U.S. Cl. ........................................ 369/50; 369/59; 360/39
[58] Field of Search ....................... 369/50, 49, 48, 47, 369/59; 358/315; 360/39

[56] References Cited

U.S. PATENT DOCUMENTS

| 3,379,839 | 4/1968 | Bennett | 369/48 |
| 3,430,215 | 7/1969 | Krossa et al. | 369/48 |
| 4,169,219 | 9/1979 | Beard | 369/48 |
| 4,383,279 | 5/1983 | Kenney, II | 358/341 |
| 4,397,010 | 8/1983 | Nabeshima | 369/50 |
| 4,528,664 | 6/1985 | Cheng et al. | 379/381 |
| 4,543,650 | 9/1985 | Wachi | 369/50 |

FOREIGN PATENT DOCUMENTS 1332219 7/1973 United Kingdom .

OTHER PUBLICATIONS

"Aiwa Offers High-End Functions in the Popular Price Range", Journal of the Electronics Industry, Feb. 1989, p. 43.

Primary Examiner—Roy N. Envall, Jr.
Assistant Examiner—Thai Tran
Attorney, Agent, or Firm—Leroy Eason

[57] ABSTRACT

A signal processor produces a digital signal (Vd), which may be derived from digital information recorded on an information carrier, and applies it to a peak detector for generating a control signal (Vr) which corresponds to the peak value of the digital signal. The digital signal is also applied to a digital amplifier whose gain is controllable by the control signal so that the resulting amplified digital signal (Vv) will drive a digital-to-analog converter to the maximum extent of its conversion range, thereby maximizing the analog output signal (Va) of the converter. The peak detector may be adapted to produce the control signal in accordance with a peak code (Vp) already recorded on the information carrier, which peak code is derived therefrom by the signal processor and indicates the peak digital value of the recorded digital information.

2 Claims, 1 Drawing Sheet

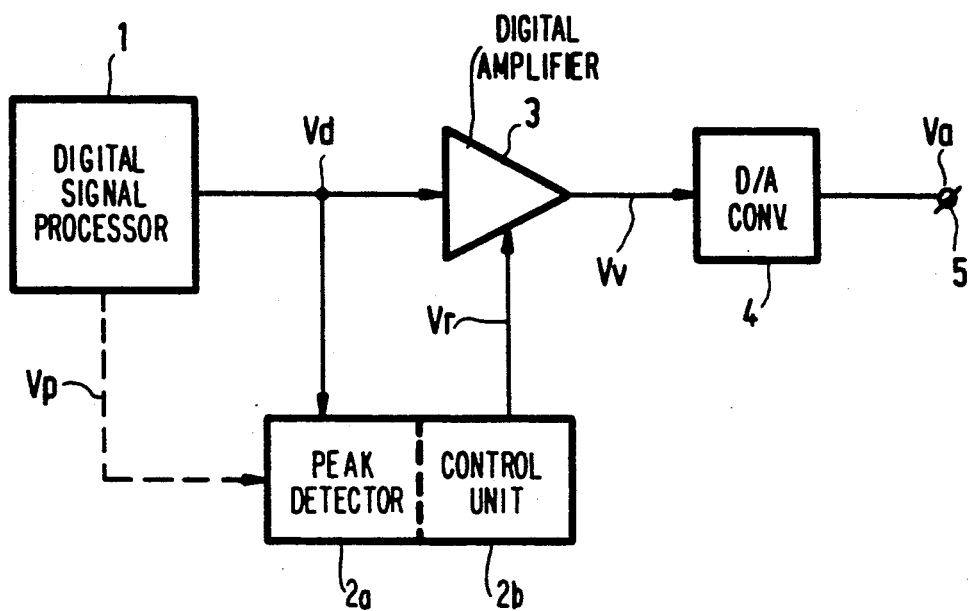

DEVICE FOR READING DIGITAL INFORMATION RECORDED ON AN INFORMATION CARRIER, AND PEAK DETECTOR AND INFORMATION CARRIER FOR SUCH A DEVICE

BACKGROUND OF THE INVENTION

1. Field of the Invention

The invention relates to a device for reading digital information recorded on an information carrier, the device comprising a signal processor for deriving a digital signal from the digital information being read and a peak detector for supplying a signal which is a measure of a peak value of the digital signal.

The invention also relates to such a peak detector and an information carrier for use with such a device.

Such a device can be used, inter alia, in Compact Disc (CD) players and Digital Audio Tape (DAT) recorders.

2. Description of the Related Art

Such a device is known from the article "Aiwa offers high-end functions in the popular price range" in the "Journal of the Electronics Industry" of Feb. 1989, page 43. The device described in the article is a CD player constructed to read information carriers in the form of Compact Discs (CDs). The digital information recorded on such CDs represents a digital audio signal, which is derived from such information after reading. By means of a digital-to-analog converter the prior-art CD player converts the digital audio signal thus derived into an analog output signal. A customary parameter used to indicate the quality of the analog output signal is the signal-to-noise ratio, which is related to the dynamic range, which is the ratio between the maximum signal level and the noise level of said output signal.

SUMMARY OF THE INVENTION

It is an object of the invention to provide a device for reading digital information recorded on an information carrier, yielding an improved signal-to-noise ratio of the analog output signal.

According to the invention, a device for reading digital information recorded on an information carrier comprises a peak detector which includes means for generating a control signal which corresponds to the peak value of the digital signal and is used for controlling the gain of a digital amplifier which produces an amplified digital signal. The control signal so generated enables the gain of the digital amplifier to be controlled in such a manner that the maximumvalue of the amplified digital signal will substantially correspond to the maximum signal value which can be handled by the digital-to-analog converter; i.e., its conversion range. Thus, the digital-to-analog converter coupled to the digital amplifier is driven to a maximum extent regardless of the magnitude of the peak value of the recorded digital signal, so that additional noise subsequently added by the converter has a minimal influence on the signal-to-noise ratio of the analog output signal. Investigations in this field show that in the case of CDs generally only a limited part of the available dynamic range of the recorded digital audio signal is used, almost two bits of the standard sixteen-bit audio signal not being utilised. Therefore, when the invention is applied to CDs it will usually yield a substantial improvement of said signal-to-noise ratio.

It is to be noted that an amplifier whose gain is controlled in accordance with a peak level of the signal to be amplified is known from British Patent Specification GB 1,332,219, but this Patent Specification describes gain control of an analog amplifier for the purpose of an optimum reproduction of electrocardiographic signals on a display screen. In contrast, the device in accordance with the invention concerns a digital system for controlling the gain of a digital amplifier so as to improve the signal-to-noise ratio of an analog output signal produced by a digital-to-analog converter from the amplified digital signal.

An embodiment of a device in accordance with the invention may be characterized in that the signal processor is adapted to derive a peak code from the digital information which is recorded on an information carrier which peak code indicates the peak value of the digital signal, and in that the peak detector is adapted to supply a control signal corresponding to such peak code. An information carrier for use in conjunction with such a device may be characterized in that the digital peak code is included in the digital information which is recorded on the information carrier. Inclusion of the peak code in the information on a digital information carrier ensures that the control signal for the digital amplifier can be obtained without prior resort to a memory of the peak detector and without regeneration of said signal. Therefore, such inclusion of the peak code is simpler and saves both time and hardware.

BRIEF DESCRIPTION OF THE DRAWING

The invention will now be described in more detail with reference to the sole accompanying FIGURE, which shows an embodiment of a device in accordance with the invention for reading digital information recorded on an information carrier.

DESCRIPTION OF THE PREFERRED EMBODIMENTS

The device shown herein comprises a digital signal processor 1, a peak detector 2, a digital amplifier 3, and a digital-to-analog converter 4 having an output terminal 5. The signal processor 1, which is of a type, for example, as commonly used in CD players or DAT recorders, produces a digital signal Vd, which is derived from digital information recorded on an information carrier. This signal Vd is applied both to the peak detector 2a and to the digital amplifier 3. In the present embodiment the peak detector 2a comprises a detection and storage unit 2a for producing a signal, referred to herein as a peak signal, which is a measure of the peak value of the digital signal Vd. The peak signal is supplied to a control unit 2b for controlling the gain of the digital amplifier 3 in accordance therewith. For this purpose the control unit 2b produces a control signal Vr which is inversely proportional to the value of the peak signal. The control signal Vr controls said gain via a control input of the amplifier 3 in such a manner that the peak value of the digital signal Vd is amplified to derive an amplified digital digital Vv having a signal value corresponding to the maximum digital value which can be handled by the digital-to-analog converter 4.

During conversion of the amplified digital signal Vv into an analog output signal Va available at the output terminal 5, the converter 4 adds analog noise to said output signal Va. However, since the gain of the digital amplifier 3 is controlled by the peak detector 2a the influence of such analog noise on the signal-to-noise ratio of the output signal Va is now minimized. Owing to the use of the invention the digital-to-analog converter 4 is capable of supplying an output signal of greatly improved signal quality.

With respect to unit 2 the peak detector 2a it may be constructed, for example, as set forth in said article in the "Journal of the Electronics Industry". Storage of the peak signal value is then effected in a memory which allows the peak signals for a plurality of information carriers to be retained and retrieved.

However, with respect to detection of the peak signal value, the device in accordance with the invention is simplified by adapting the signal processor 1 so that it is also capable of recovering a peak code Vp which has been recorded on the record carrier and which is a measure of the peak value of the digital signal Vd. For example, such a peak code Vp may be inserted in the lead-in information of an information carrier and after it has been recovered it may be applied directly to the peak detector 2. In this case the peak detector 2 need not detect the peak value of the digital signal Vd and can instead employ the peak code Vp directly as a measure of such peak value. Consequently, the control unit 2b in the peak detector 7 in accordance with the invention can then generate the control signal Vr more rapidly.

The invention is not limited to the embodiments disclosed herein. Within the scope of the invention several modifications will be conceivable to those skilled in the art. For example, the peak detector may be constructed in various manners, depending on, inter alia, the functions to be performed by the detector. Moreover, the digital amplifier may be constructed to perform further signal-processing functions such as equalizing and filtering. It is also possible to store a plurality of peak digital signal values for a single information carrier, so that for example every music track of a CD can be treated separately. Similarly, a plurality of peak codes may be recorded on an information carrier.

Peak detection and storage in order to control a digital amplifier for the purpose of signal quality improvement may also be applied to devices which do not employ information carriers as the source of the digital signal.

What is claimed is:

1. In a device for reading digital information recorded on an information carrier, a circuit arrangement comprising:
    a signal processor for deriving a digital signal (Vd) from the recorded digital information as it is read from the information carrier;
    a digital amplifier coupled to said signal processor for amplifying the digital signal (Vd) to produce an amplified digital signal (Vv), said digital amplifier having a gain which is controllable by a control signal supplied to a control terminal thereof;
    a digital-to-analog converter coupled to said digital amplifier for converting the amplified digital signal (Vv) produced thereby to a corresponding analog signal (Va), the analog signal (Va) having a maximum amplitude when the value of said amplified digital signal (Vv) corresponds to a maximum conversion range of said converter; and
    a peak detector coupled to said signal processor for deriving from said digital signal (Vd) a peak signal corresponding to a peak value thereof and producing from said peak signal a control signal corresponding thereto, said control signal being supplied to the control terminal of said amplifier to control the gain thereof so that the maximum value of said amplified digital signal (Vv) corresponds to said maximum conversion range of said converter;
    whereby said analog signal (Va) will have its maximum amplitude despite changes in the peak value of said digital signal (Vd).

2. A device as claimed in claim 1, characterized in that the digital information recorded on the information carrier includes a peak code indicative of the peak value of said digital signal (Vd), said signal processor is adapted to derive said peak code from said recorded digital information, and said peak detector is adapted to derive said peak signal from the peak code supplied thereto by said signal processor.

* * * * *